US012032001B2

(12) United States Patent
Lin et al.

(10) Patent No.: US 12,032,001 B2
(45) Date of Patent: Jul. 9, 2024

(54) TESTING DEVICE AND METHOD FOR TESTING A DEVICE UNDER TEST

(71) Applicants: Advanced Semiconductor Engineering, Inc., Kaohsiung (TW); ASE TEST, INC., Kaohsiung (TW)

(72) Inventors: Jia Jin Lin, Kaohsiung (TW); Chia Hsiang Wang, Kaohsiung (TW); Shih Pin Chung, Kaohsiung (TW); Wei Shuo Chu, Kaohsiung (TW); You Lin Lee, Kaohsiung (TW); Pin Heng Kuo, Kaohsiung (TW); Cheng Chia Tu, Kaohsiung (TW)

(73) Assignees: ADVANCED SEMICONDUCTOR ENGINEERING, INC., Kaohsiung (TW); ASE TEST, INC., Kaohsiung (TW)

( * ) Notice: Subject to any disclaimer, the term of this patent is extended or adjusted under 35 U.S.C. 154(b) by 77 days.

(21) Appl. No.: 17/722,219

(22) Filed: Apr. 15, 2022

(65) Prior Publication Data

US 2023/0333139 A1    Oct. 19, 2023

(51) Int. Cl.
  *G01R 31/26* (2020.01)
  *G01R 1/04* (2006.01)
  *G01R 31/28* (2006.01)

(52) U.S. Cl.
  CPC ....... *G01R 1/0466* (2013.01); *G01R 31/2863* (2013.01)

(58) Field of Classification Search
  CPC ............ G01R 31/2863; G01R 31/2891; G01R 1/0466
  See application file for complete search history.

(56) References Cited

U.S. PATENT DOCUMENTS

| 6,388,457 B1* | 5/2002 | Loh ...................... G01R 1/0466 |
| | | 324/762.02 |
| 9,664,706 B2* | 5/2017 | Choi ..................... G01R 1/0466 |
| 9,874,605 B2 | 1/2018 | Aizawa et al. |
| 2013/0200911 A1 | 8/2013 | Panagas |
| 2018/0059176 A1* | 3/2018 | Ding ..................... G01R 35/005 |
| 2022/0034750 A1* | 2/2022 | Myslinski .......... G01M 11/0214 |

FOREIGN PATENT DOCUMENTS

| JP | 2001004696 | * | 1/2001 |
| TW | 201341803 A | | 10/2013 |
| TW | 201602586 A | | 1/2016 |

OTHER PUBLICATIONS

Office Action from corresponding Taiwanese Patent Application No. 11113334, issued on May 16, 2024, 5 pages.
Search Report with English translation from corresponding Taiwanese Patent Application No. 111133344, issued May 16, 2024, 3 pages.

* cited by examiner

*Primary Examiner* — Thang X Le
(74) *Attorney, Agent, or Firm* — FOLEY & LARDNER LLP

(57) ABSTRACT

A testing device is disclosed. The testing device includes a socket configured to support a DUT and a first detection module disposed at a first side of the socket and configured to detect a location relationship between the DUT and the socket.

15 Claims, 10 Drawing Sheets

TESTING DEVICE AND METHOD FOR TESTING A DEVICE UNDER TEST

BACKGROUND

1. Technical Field

The present disclosure generally relates to a testing device and a method for testing a device under test.

2. Description of the Related Art

Testing devices (such as wafer probers) are used to test characteristics of DUT (devices under test), such as IC (integrated circuit) devices, to determine compliance with product specifications.

The DUT normally requires accurate alignment according to a predetermined reference coordinate system. Faulty alignment of the DUT can affect test results and impair yield.

SUMMARY

Embodiments of the present disclosure provide a testing device. The testing device includes a socket configured to support a device under test (DUT) and a first detection module disposed at a first side of the socket and configured to detect a location relationship between the DUT and the socket.

Embodiments of the present disclosure provide a testing device. The testing device includes a socket configured to support a DUT, a first detection module and a second detection module. The first detection module and the second detection module are collectively configured to detect a shift of the DUT.

Embodiments of the present disclosure provide a method for testing a DUT. The method includes placing the DUT on a carrier and detecting a location relationship between the DUT and the carrier to check whether the DUT is placed at a predetermined location.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
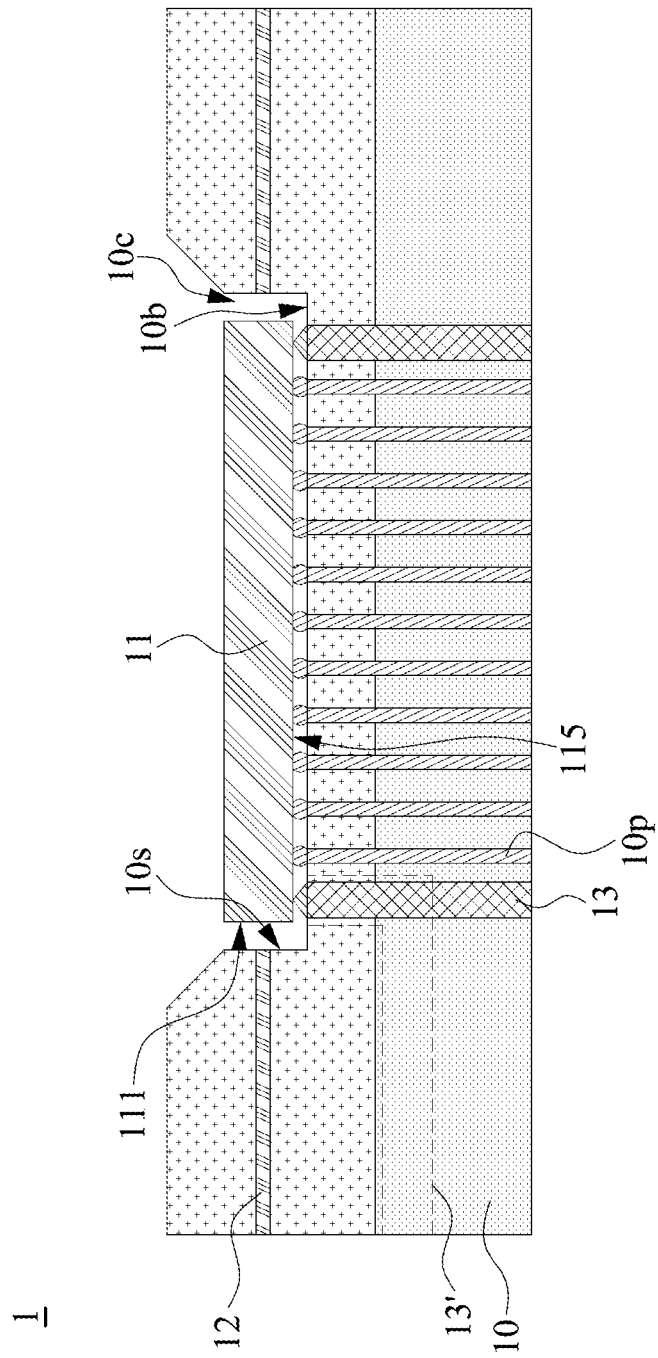
FIG. 1A is a cross-section of a testing device in accordance with some arrangements of the present disclosure.

The following disclosure provides many different arrangements, or examples, for implementing different features of the provided subject matter. Specific examples of components and arrangements are described as follows. These are, of course, merely examples and are not intended to be limiting. In the present disclosure, reference to the formation of a first feature over or on a second feature in the description that follows may include arrangements in which the first and second features are formed in direct contact, and may also include arrangements in which additional features may be formed between the first and second features, such that the first and second features may not be in direct contact. In addition, the present disclosure may repeat reference numerals and/or letters in the various examples. This repetition is for simplicity and clarity and does not in itself dictate a relationship between the various arrangements and/or configurations discussed.

Arrangements of the present disclosure are discussed here in detail. It should be appreciated, however, that the present disclosure provides many applicable concepts that can be embodied in a wide variety of specific contexts. The specific arrangements discussed are merely illustrative and do not limit the scope of the disclosure.

FIG. 1A is a cross-section of a testing device 1 in accordance with some arrangements of the present disclosure. The testing device 1 may include a carrier 10 on which a DUT (device under test) 11 is placed, and detection modules 12 and 13.

The testing device 1 may be used to evaluate qualities or test characteristics (e.g., the electrical characteristics) of the DUT 11. In some embodiments, the testing device 1 may include a wafer prober. Where applicable, the present disclosure may be applied to other testing tools or substrate processing tools.

The DUT 11 may be or include a wafer, a substrate, a circuit board, etc. The DUT 11 may be considered as any substrate or a target portion that can be disposed on the carrier 10 to undergo testing. In some embodiments, the DUT 11 may include a plurality of dies or semiconductor devices (not shown in the figures), each having a plurality of conductive pads, bonding pads, contact pads, or other contact interconnects formed on its surface.

The carrier 10 may be configured to support the DUT 11. The carrier 10 may include or be a socket, chuck, supporting plate, etc. In some embodiments, the carrier 10 may include a bottom surface $10b$ and a sidewall (or a side) $10s$. The bottom surface $10b$ and the sidewall $10s$ define a cavity (or a recess) $10c$ for accommodating the DUT 11. When the DUT 11 is accommodated in the cavity $10c$, the sidewall $10s$ surrounds the DUT 11 and faces lateral surfaces (such as a lateral surface 111) of the DUT 11.

One or more conductive pins or testing channels $10p$ may be partially exposed from the bottom surface $10b$ of the carrier 10. The conductive pins $10p$ may each be substantially perpendicular to the bottom surface 10b of the carrier 10. For example, the conductive pins 10p may each extend toward the bottom surface 10b in a direction substantially perpendicular thereto.

When the DUT 11 is accommodated in the cavity 10c, the conductive pins 10p may contact the contact interconnects of the DUT 11 for electrically connecting the DUT 11 to the testing device 1 and testing the electrical characteristics of the DUT 11.

The detection module 12 may be integrated in the carrier 10. The detection module 12 may be entirely or partially disposed within the carrier 10. The detection module 12 may be entirely or partially embedded in the carrier 10. In some embodiments, the detection module 12 may be disposed within the sidewall 10s of the carrier 10. A portion of the detection module 12 may be exposed by the sidewall 10s. When the DUT 11 is accommodated in the cavity 10c, the detection module 12 may be adjacent to and face the lateral surfaces (such as the lateral surface 111) of the DUT 11.

Similarly, the detection module 13 may be integrated in the carrier 10. The detection module 13 may be entirely or partially disposed within the carrier 10. The detection module 13 may be entirely or partially embedded in the carrier 10. In some embodiments, the detection module 13 may be disposed within the bottom surface 10b of the carrier 10. In some embodiments, the detection module 13 may be disposed at a bottom side of the carrier 10. A portion of the detection module 13 may be exposed by the bottom surface 10b. When the DUT 11 is accommodated in the cavity 10c, the detection module 13 may be adjacent to and face a bottom surface 115 of the DUT 11.

In some embodiments, the detection module 13 may be adjacent to the conductive pins 10p. In some embodiments, the detection module 13 may extend along with the conductive pins 10p as shown in FIG. 1A. However, in some other embodiments, as illustrated by the dashed lines, the detection module 13' may have a portion extending along with the conductive pins 10p and another portion extending along with the detection module 12. For example, the detection module 13' may have a curved portion or a bent portion.

The detection module 12 and the detection module 13 may each be disposed at a side of the carrier 10. The detection module 12 and the detection module 13 may be disposed at different or distinct sides of the carrier 10. The detection module 12 and the detection module 13 may each be configured to detect or determine a location relationship between the DUT 11 and the carrier 10. For example, the detection module 12 and the detection module 13 may each be configured to detect a relative position or a relative movement of the DUT 11 with respect to the carrier 10. In some embodiments, the location relationship may include a displacement of the DUT 11, a shift of the DUT 11, a rotation of the DUT 11, a tilt of the DUT 11, or other movement of the DUT 11, or a combination thereof.

The detection module 12 and the detection module 13 may each include an optical device. The detection module 12 and the detection module 13 may each be configured to emit light, analyze light and its characteristics, and produce a representative electronic signal. In some embodiments, the detection module 12 and the detection module 13 may each include one or more light transceivers. In some embodiments, the detection module 12 and the detection module 13 may be used in combination with other types of sensors, such as a capacitive sensor, a photodiode array sensor, a confocal sensor, a profile scanner, a light detection and ranging (LiDAR), a pressure sensor, or a combination thereof. For example, other types of sensors may be included along with the detection module 12 and the detection module 13 in any combination as part of the carrier 10.

Figure 1B:
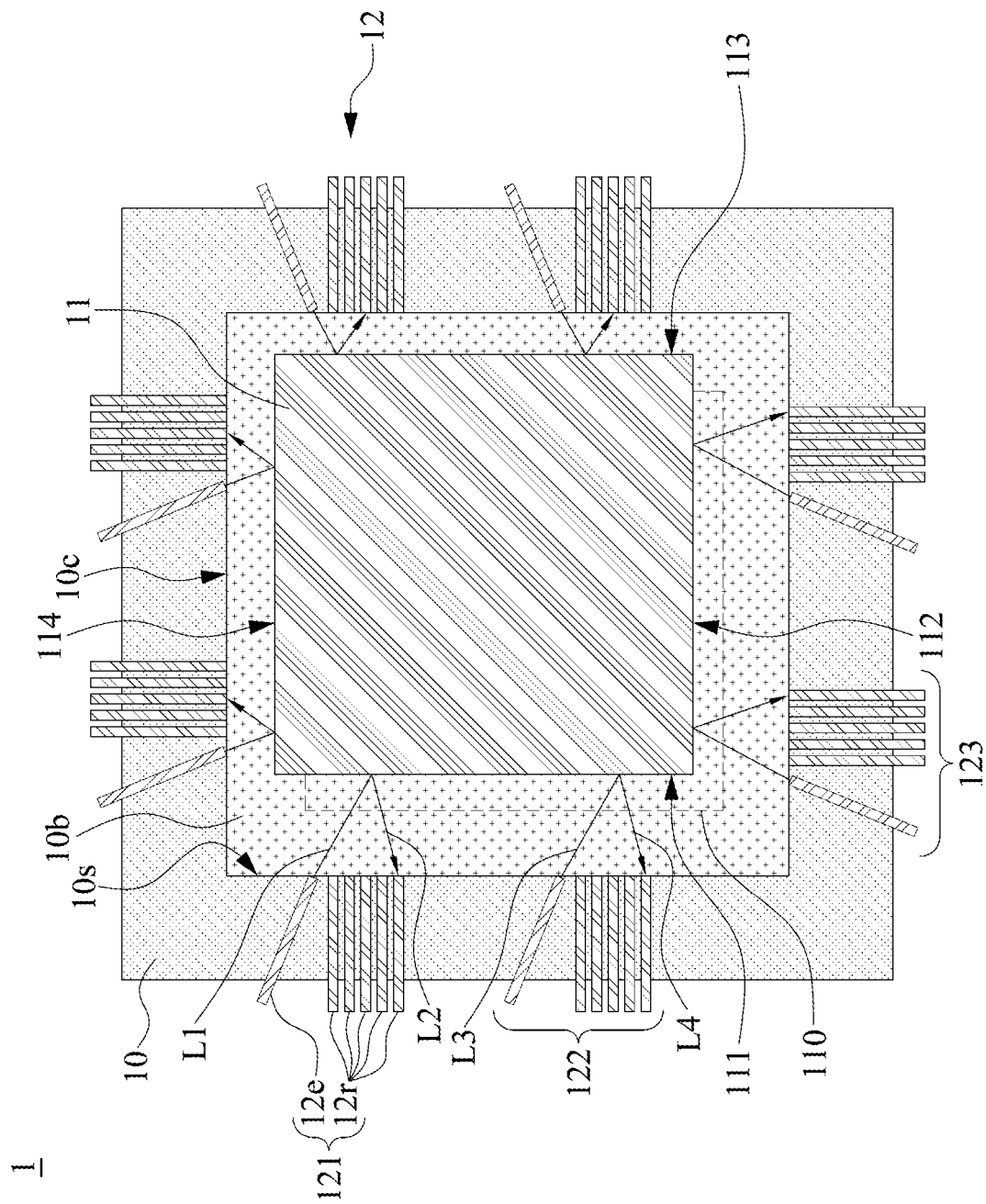
FIG. 1B is a top view of a testing device in accordance with some arrangements of the present disclosure.

FIG. 1B is a top view of the testing device 1 in accordance with some arrangements of the present disclosure. The DUT 11 is accommodated in the cavity 10c of the carrier 10 of the testing device 1. The DUT 11 is displaced or shifted from a determined location 110 (illustrated by the dashed lines).

The DUT 11 may include lateral surfaces 111, 112, 113, and 114. The lateral surface 112 may be substantially parallel to the lateral surface 114. The lateral surface 111 may be substantially parallel to the lateral surface 113. The lateral surface 112 may be substantially perpendicular to the lateral surfaces 111 and 113. The lateral surface 114 may be substantially perpendicular to the lateral surfaces 111 and 113.

The detection module 12 may include a plurality of light transceivers (such as light transceivers 121, 122, and 123). Although the light transceivers are described as parts of a detection module, the light transceivers may each be a detection module. For example, the light transceiver 121 may be a detection module (or be a part of the detection module) adjacent to the lateral surface 111. For example, the light transceiver 122 may be a detection module (or be a part of the detection module) adjacent to the lateral surface 111. For example, the light transceiver 123 may be a detection module (or be a part of the detection module) adjacent to the lateral surface 112. The light transceivers may surround the DUT 11. The light transceivers may be adjacent to the lateral surfaces 111, 112, 113, and 114. The light transceiver 121 and the light transceiver 122 may be adjacent to the same lateral surface (i.e., the lateral surface 111) of the DUT 11.

While two light transceivers are adjacent to each of the lateral surfaces 111, 112, 113, and 114 of the DUT 11, the number, location, and arrangement of the transceivers can be adjusted based on design requirements and are not limited to the specific embodiments illustrated in the figures.

The light transceivers may each include one or more light emitters (or light sources) and one or more light receivers (or light sensors). For example, the light transceiver 121 may include a light emitter 12e and a plurality of light receivers 12r. The light transceivers may each include one or more fibers, such as optical fibers.

The light receivers 12r may be a set or a group of light receivers 12r. The light receivers 12r may function together. The light receivers 12r may be collectively disposed on the same side of the light emitter 12e. The light receivers 12r may function in combination with the light emitter 12e. For example, the light emitter 12e may be configured to emit, radiate or generate light L1 toward the lateral surface 111 of the DUT 11. The light receivers 12r may be configured to receive or detect reflected light L2 of the light L1 reflected by the lateral surface 111 of the DUT 11.

Similarly, the light transceiver 122 may include a light emitter configured to emit light L3 toward the lateral surface 111 of the DUT 11 and a set of light receivers configured to receive reflected light L4 of the light L3.

The light (such as the light L1 and the light L3) generated from the light transceivers may encompass all types of electromagnetic (EM) radiation, including radio waves, microwaves, infrared (IR) light, visible light, white light, ultraviolet (UV) radiation, extreme ultra-violet (EUV) radiation, X-rays, and gamma rays.

In some embodiments, the light (such as the light L1 and the light L3) generated from the light transceivers may be a light beam having a plurality of different frequencies. Additionally or alternatively, the light generated from the light transceivers may be a monochromatic light beam having one single wavelength, such as a laser beam or a light beam having a spectral linewidth of nearly zero.

The light (such as the light L1 and the light L3) generated from the light transceivers may have an incident angle with respect to the lateral surface of the DUT 11. The incident angle may be between 0° and 90°.

Figure 1C:
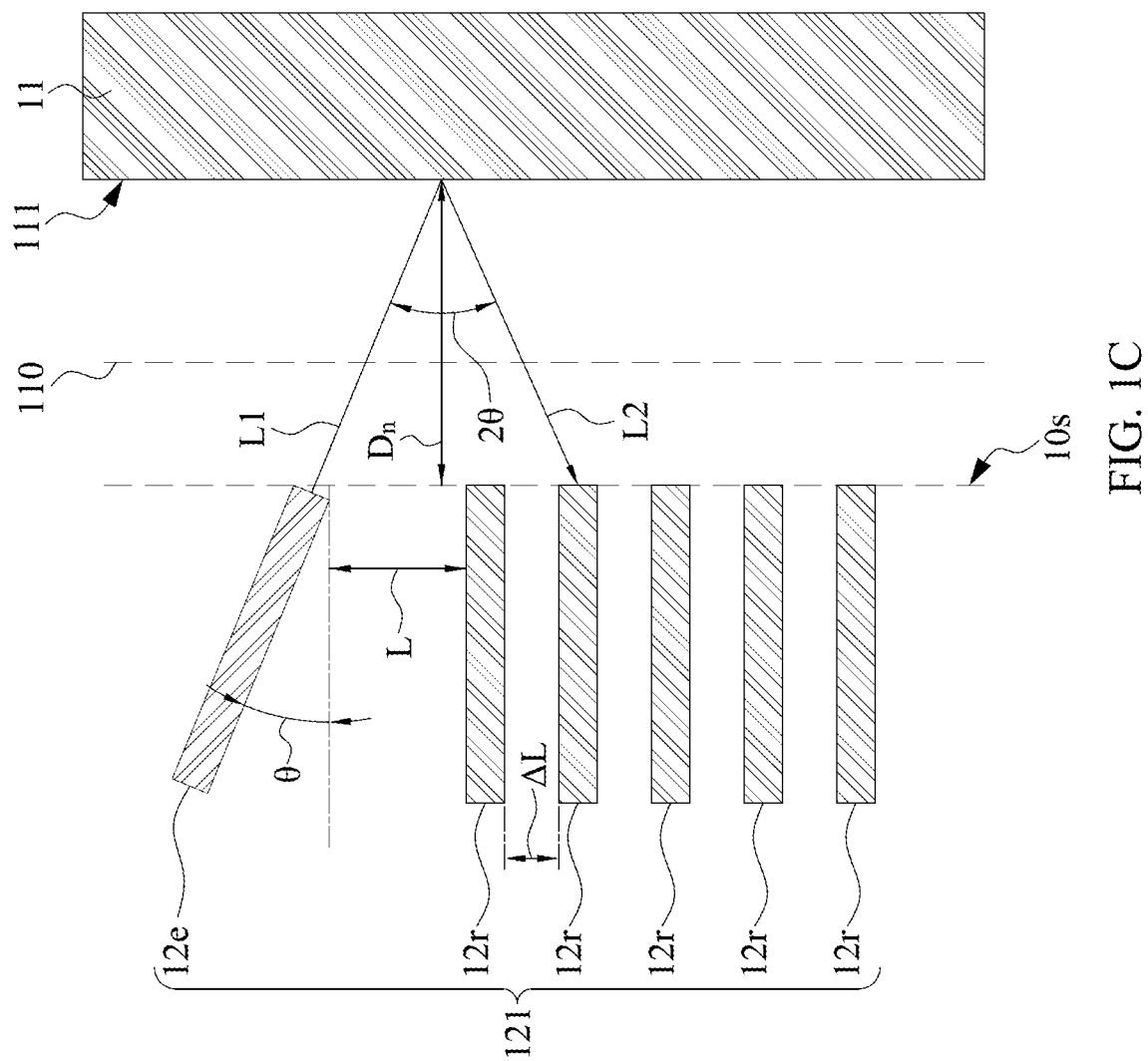
FIG. 1C is an enlarged view of a part of FIG. 1B in accordance with some arrangements of the present disclosure.

FIG. 1C is an enlarged view of a part of FIG. 1B in accordance with some arrangements of the present disclosure. A location relationship between the DUT 11 and the carrier 10 can be calculated through the following formula.

$$D_n = \frac{L + (n-1)\Delta L}{2\tan\theta}$$

In this formula, "$D_n$" represents the minimum distance between the light transceiver 121 and the lateral surface 111 of the DUT 11. "$D_n$" also represents a distance between the lateral surface 111 of the DUT 11 and the sidewall 10s of the carrier 10.

"n" represents the serial number of one of the light receivers receiving the light L2. For example, if light receiver $R_{X1}$ receives the light L2, then the serial number n is set as 1, and if light receiver $R_{X2}$ receives the light L2, then the serial number n is set as 2.

In addition, "θ" represents the incident angle of the light L1 with respect to the lateral surface 111 of the DUT 11. "L" represents the minimum distance between the light emitter $T_X$ and the light receiver $R_{X1}$. "$\Delta L$" represents the minimum distance between two adjacent light receivers.

Since tan θ, L and ΔL in this formula can be constant or fixed, the minimum distance $D_n$ can be determined by the serial number n. In other words, the minimum distance $D_n$ can be obtained by determining which one of the light receivers $R_{X1}$, $R_{X2}$, $R_{X3}$, $R_{X4}$, and $R_{X5}$ receives the light L2. For example, the light transceiver 121 and the light transceiver 122 may be collectively configured to detect a shift of the DUT 11, such as a displacement of the DUT 11, a rotation of the DUT 11, a tilt of the DUT 11, or other movement of the DUT 11, or a combination thereof.

In some embodiments, the light receiver receiving the light L2 may produce a signal indicating the serial number n thereof. In some embodiments, the detection module 12 may be configured to calculate the minimum distance $D_n$ based on the signal.

In some embodiments, if two or more of the light receivers $R_{X1}$, $R_{X2}$, $R_{X3}$, $R_{X4}$, and $R_{X5}$ receive the light L2, the minimum distance $D_n$ can be obtained by determining which of the light receivers $R_{X1}$, $R_{X2}$, $R_{X3}$, $R_{X4}$, and $R_{X5}$ receives the light of the greatest intensity or magnitude.

For example, the light receiver receiving the light of the greatest intensity may produce a signal indicating the serial number n thereof. In some embodiments, the detection module 12 may be configured to calculate the minimum distance $D_n$ based on the signal.

In some embodiments, as shown in FIG. 1B, the DUT 11 shifts in an upper-right direction with respect to the carrier 10. For example, the DUT 11 has a horizontal shift to the upper side and a horizontal shift to the right side.

The shift distance to the right side can be obtained by the light transceiver 121. In addition, the shift distance to the upper side can be obtained by the light transceiver 123.

In some embodiments, the detection module 12 (and/or the detection module 13) may include a memory unit (not shown in the figures) and a processing unit (not shown in the figures) communicating with the light transceivers of the detection module 12.

The memory unit may be configured to store data, such as records, indices, or parameters associated with the formula, the information of the light (e.g., the light L1, the light L2, the light L3 and the light L4), the signal from the light transceivers, contained minimum distances, test results, etc. The memory unit may also be configured to store algorithms or computer-executable instructions. In some embodiments, the memory unit may include random access memory (RAM), read only memory (ROM), hard drives, as well as removable memory devices, which can include memory sticks, memory cards, flash drives, external hard drives, and so on.

The processing unit may be configured to execute algorithms or computer-executable instructions stored in the memory unit or another medium. The processing unit may be configured to conduct testing of the present disclosure. For example, the processing unit may be configured to receive the signal indicating the serial number n, obtain the minimum distance Dn, and determine the location relationship between the DUT 11 and the carrier 10. For example, the processing unit may be configured to check whether the DUT 11 is placed at a predetermined location. For example, the processing unit may be configured to check whether the DUT 11 is placed at a location within a predetermined shift from a predetermined location.

For example, the processing unit may be configured to perform testing of testing characteristics of the DUT 11, and correct or adjust the test results based on the location relationship.

In some embodiments, the processing unit may include (or may be) a processor (e.g., a central processing unit (CPU), a graphic processing unit (GPU), a micro processing unit (MCU), an application specific integrated circuit (ASIC) or the like) or a controller.

Figure 1D:
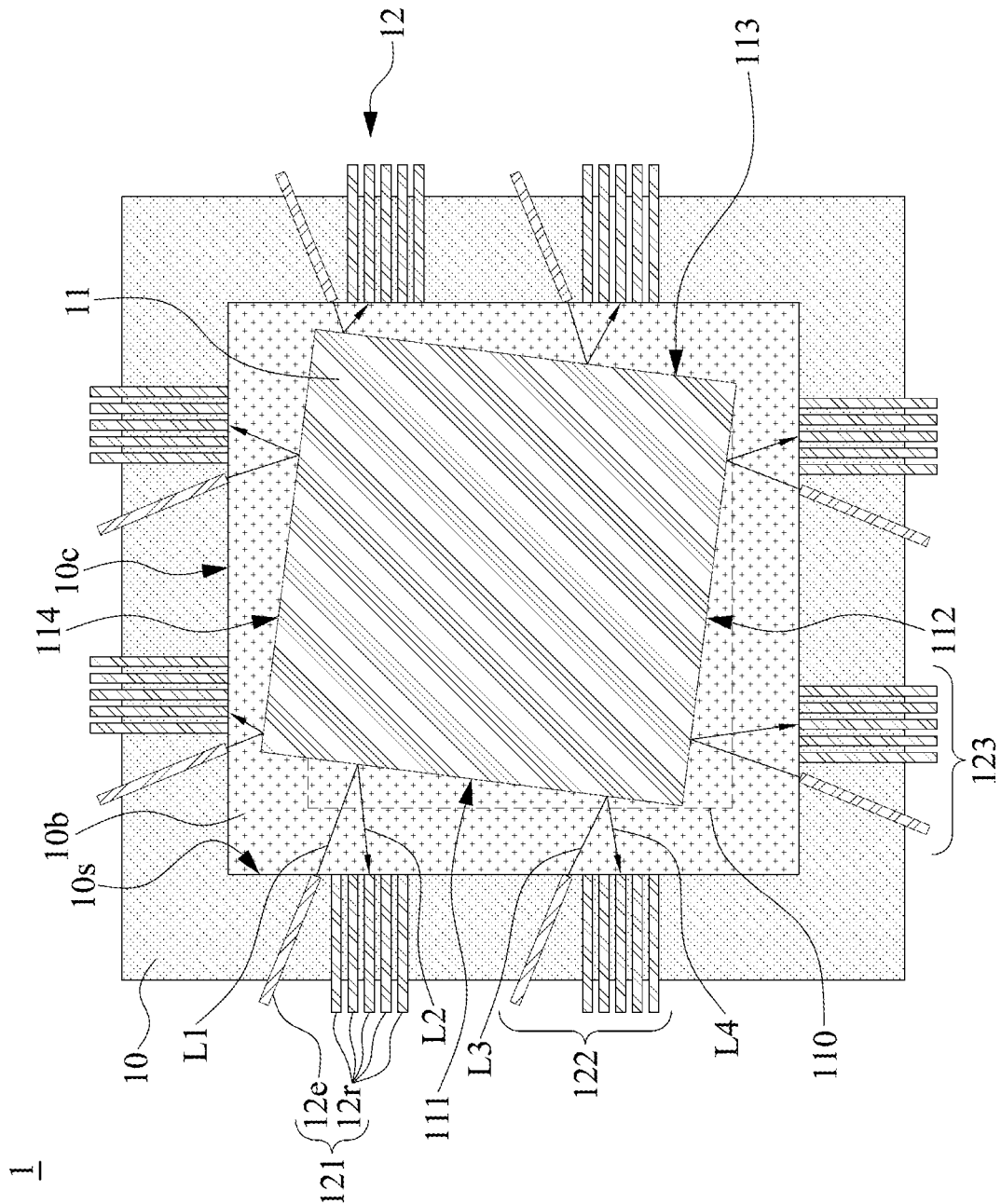
FIG. 1D is a top view of a testing device in accordance with some arrangements of the present disclosure.
Figure 1E:
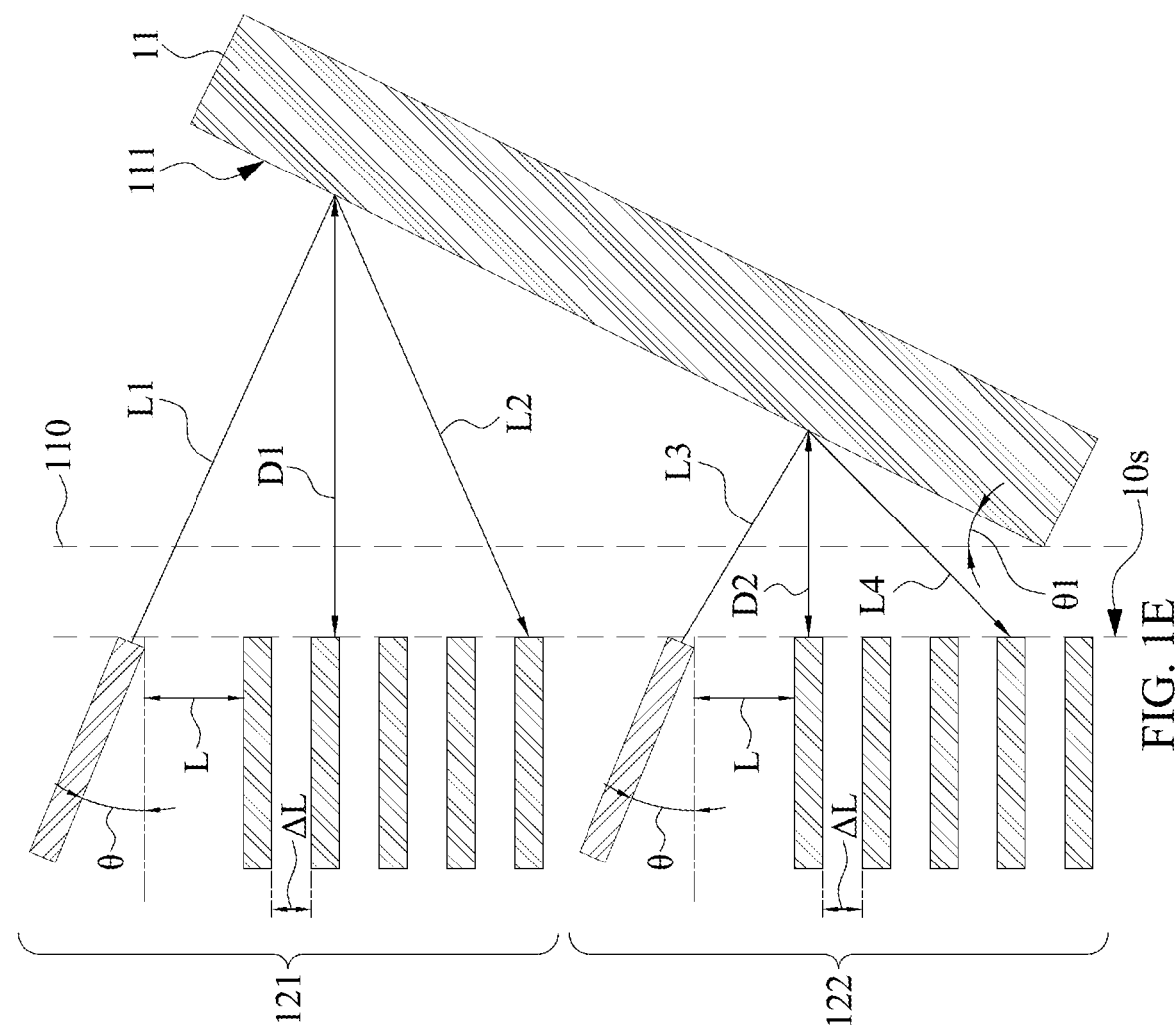
FIG. 1E is an enlarged view of a part of FIG. 1D in accordance with some arrangements of the present disclosure.

FIG. 1D is a top view of the testing device 1 in accordance with some arrangements of the present disclosure. FIG. 1D differs from FIG. 1B in that the DUT 11 in FIG. 1D is rotated with respect to the determined location 110. FIG. 1E is an enlarged view of a part of FIG. 1D in accordance with some arrangements of the present disclosure.

"D1" represents the minimum distance between the light transceiver 121 and the lateral surface 111 of the DUT 11. "D2" represents the minimum distance between the light transceiver 122 and the lateral surface 111 of the DUT 11.

Similar to the minimum distance $D_n$, in FIG. 1C, the minimum distance D1 can be determined depending on which light receiver in the light transceiver 121 receives the reflected light L2 (or depending on which light receiver in the light transceiver 121 receives the light of the greatest intensity). The minimum distance D2 can be determined depending on which light receiver in the light transceiver 122 receives the reflected light L4 (or depending on which light receiver in the light transceiver 122 receives the light of the greatest intensity). A rotation angle θ1 of the DUT 11 with respect to the determined location 110 can be obtained through trigonometric functions of the minimum distances D1 and D2.

In some embodiments, if the minimum distances D1 and D2 are equal, it can be determined that the DUT 11 does not rotate with respect to the determined location 110.

Figure 1F:
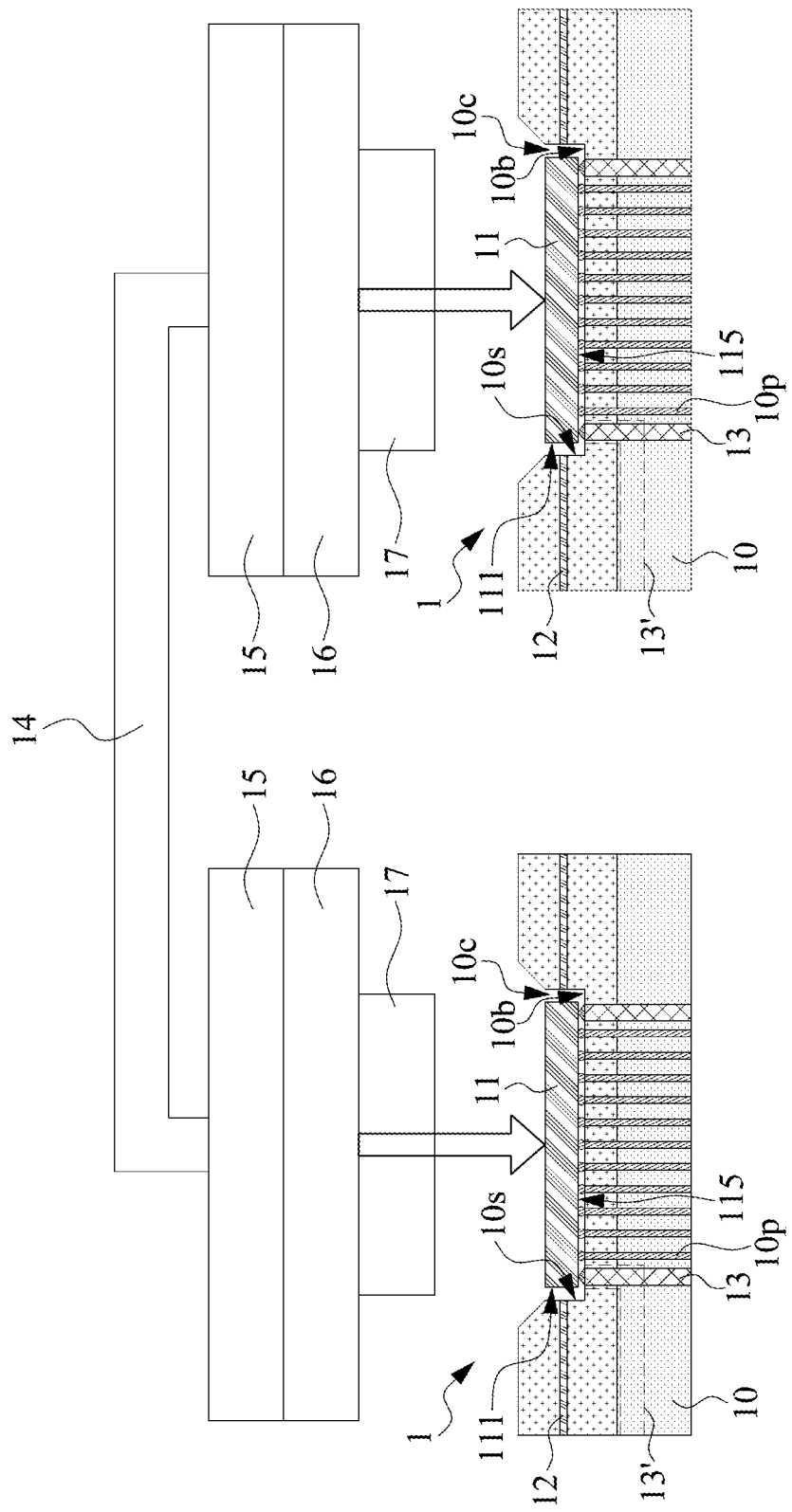
FIG. 1F is a side view of a test apparatus in accordance with some arrangements of the present disclosure.

FIG. 1F is a side view of a test apparatus in accordance with some arrangements of the present disclosure. The test apparatus may include an arm 14, one or more test chunks 15, one or more headers 16, one or more pressurers 17 and one or more testing devices 1. The test chunk 15, the header 16, and the pressurer 17 are supported by the arm 14 above the carrier 10 of the testing device 1.

The arm 14 may have two branches. The number of branches can vary depending on the number of DUTs to be tested concurrently. The pressurers 17 may be configured to press against the DUT 11.

Different heights of the branches and dimension deviations of the components of the test apparatus may accumulatively affect the stability of the test process. For example, uneven or unequal force from the pressurer 17 on the DUT 11 may cause the DUT 11 to move (such as to shift in FIG. 1B or to rotate in FIG. 1D) from the determined location 110. Unalignment of the DUT 11 may affect test results and cause yield loss. The test results may be adjusted manually. However, manual adjustment is time-consuming and standards may differ from person to person. Human error may occur, thereby causing yield loss.

By incorporating the detection modules 12 and 13 in the carrier 10 of the testing device 1, the location relationship between the DUT 11 and the carrier 10 can be determined. The test results can be corrected or adjusted based on the location relationship obtained by the detection modules 12 and 13. Therefore, the stability of test results can be enhanced.

Furthermore, the precision or resolution (or range resolution) of the detection modules 12 and 13 can be less than about 5 micrometers (μm). For example, the detection modules 12 and 13 can detect a movement distance of the DUT 11 less than about 5 μm. For example, a dimension (such as the diameter) of each of the light emitters and the light receivers may be less than about 0.009 millimeters (mm). The minimum distance ΔL between two adjacent light receivers may be about 63.5 μm. Therefore, the precision or resolution of the detection modules 12 and 13 can be about 2.77 μm. Such a high resolution can be beneficial to a DUT with a relatively high density or high integration of semiconductor devices.

Figure 2:
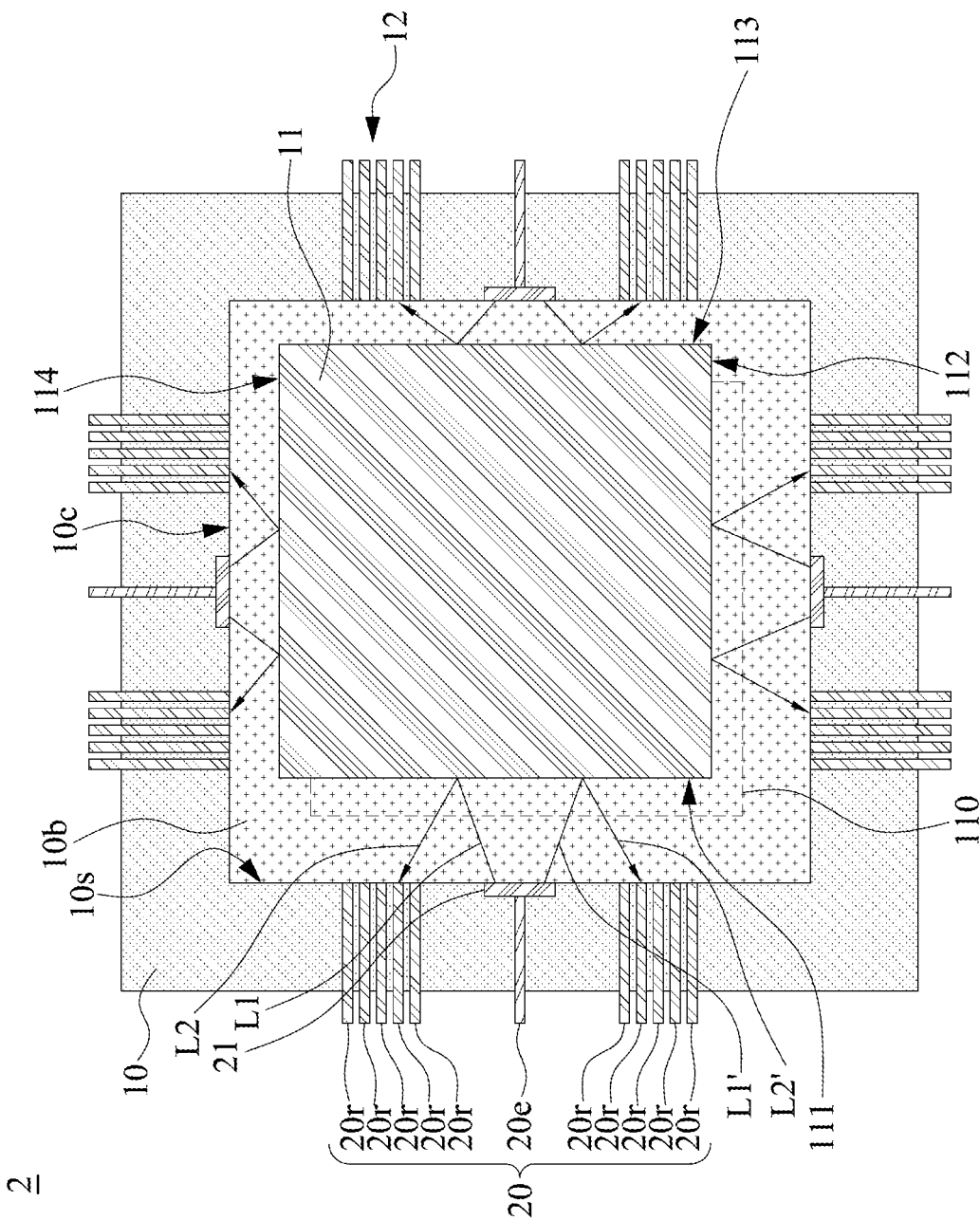
FIG. 2 is a top view of a testing device in accordance with some arrangements of the present disclosure.

FIG. 2 is a top view of a testing device 2 in accordance with some arrangements of the present disclosure. The testing device 2 in FIG. 2 is similar to the testing device 1 in FIG. 1B, with differences therebetween as follows.

There is one light transceiver in adjacent to each of the lateral surfaces 111, 112, 113, and 114 of the DUT 11. The light transceivers may each include one or more light emitters (or light sources) and one or more light receivers (or light sensors). For example, the light transceiver 20 may include a light emitter 20e and a plurality of light receivers 20r. Some of the light receivers 20r are disposed on a side of the light emitter 20e and the others are disposed on an opposite side of the light emitter 20e.

The light emitter 20e may extend in a direction substantially perpendicular to the lateral surface 111 of the DUT 11. An optical diffraction component 21 may be disposed on a surface of the light emitter 20e. The light emitter 20e may be configured to emit, radiate or generate light toward the optical diffraction component 21. The optical diffraction component 21 may be configured to diffract the light emitted by the light emitter 20e into the light L1 and the light L1'. The optical diffraction component 21 may include a grating.

The light L1 and the light L1' may include more than one light beams which propagating toward the lateral surface 111 of the DUT 11 from different directions. In some embodiments, the light beams may have different incident angles.

The light receivers 20r may be configured to receive or detect the reflected light L2 of the light L1 and the reflected light L2' of the light L1' as reflected by the lateral surface 111 of the DUT 11.

By using the optical diffraction component 21, only a single light emitter is needed to be disposed on one side of the DUT 11 to detect whether the DUT 11 is rotated and/or to determine the rotation angle.

Figure 3:
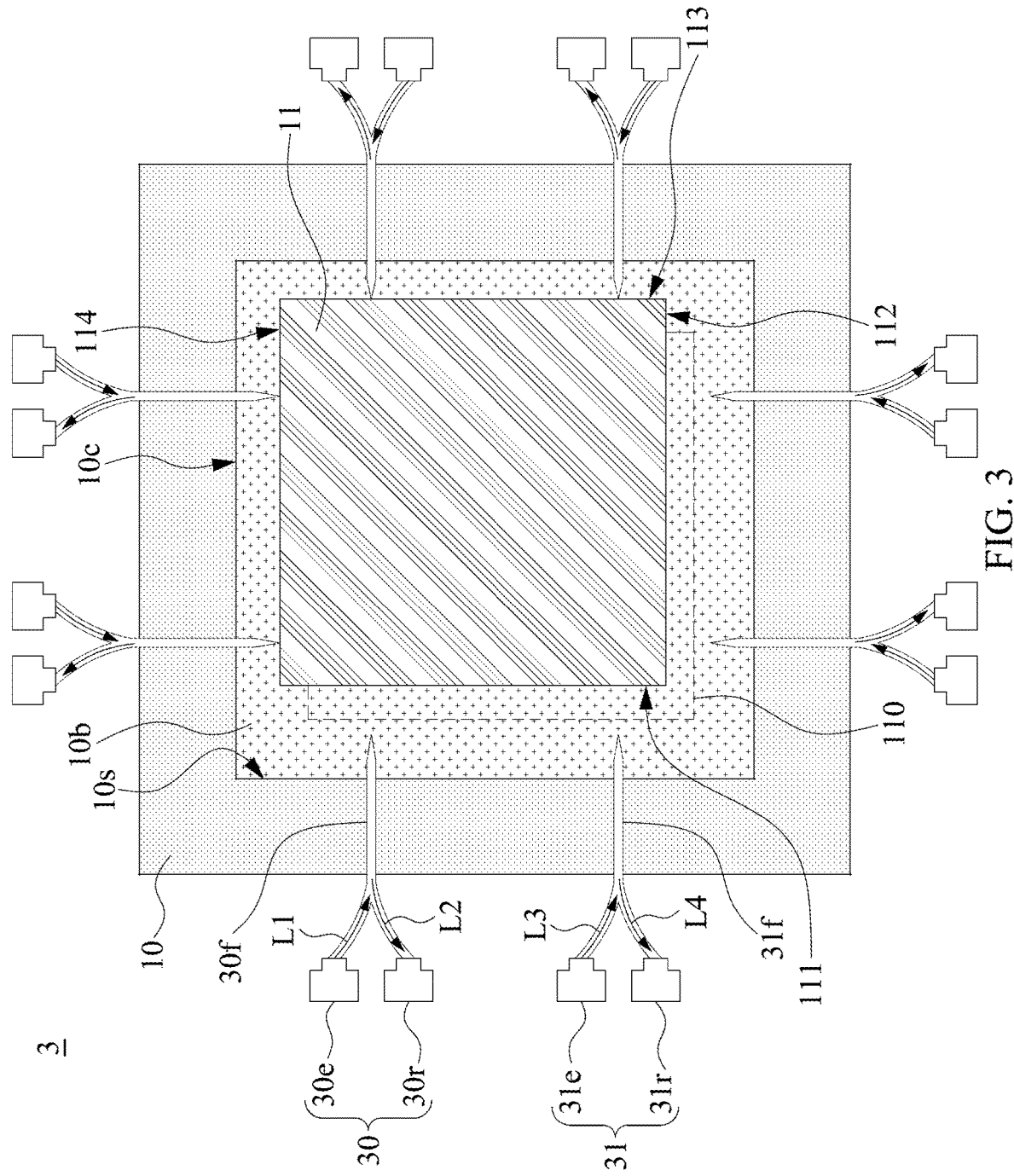
FIG. 3 is a top view of a testing device in accordance with some arrangements of the present disclosure.

FIG. 3 is a top view of a testing device 3 in accordance with some arrangements of the present disclosure. The testing device 3 in FIG. 3 is similar to the portion of the testing device 1 in FIG. 1B, with differences therebetween as follows.

Two light transceivers adjacent to each of the lateral surfaces 111, 112, 113, and 114 of the DUT 11 may each include one or more light emitters (or light sources), one or more light receivers (or light sensors) and one or more fibers.

For example, the light transceiver 30 may include a light emitter 30e and a light receiver 30r. The light emitter 30e and the light receiver 30r may be connected with a fiber 30f. The light emitter 30e and the light receiver 30r may be disposed outside of the carrier 10. The fiber 30f may be integrated in the carrier 10 and connected to or communicated with the light emitter 30e and the light receiver 30r.

The light emitter 30e may be configured to emit, radiate or generate light L1 to the fiber 30f. The fiber 30f may be configured to transmit the light L1 toward the lateral surface 111 of the DUT 11. The reflected light L2 of the light L1 may transmit to the light receivers 30r through the fiber 30f and then be received or detected by the light receivers 30r.

Similarly, the light emitter 31e may be configured to emit light L3 to the fiber 31f. The fiber 31f may be configured to transmit the light L3 toward the lateral surface 111 of the DUT 11. The reflected light L4 of the light L3 may transmit to the light receivers 31r through the fiber 31f and then be received or detected by the light receivers 31r.

In some embodiments, the detection module of the testing device 3 may be configured to detect or determine a location relationship between the DUT 11 and the carrier 10 based on the intensity of the reflected light (such as the reflected light L2 and the reflected light L4).

In some embodiments, the light receiver may produce a signal indicating the intensity of the reflected light. The detection module may be configured to determine the location relationship based on the signal.

If the distance is short, the signal is stronger and the intensity higher. In some embodiments, the precision or resolution (or range resolution) of the detection module of the testing device 3 may be adjusted. For example, the detection module of the testing device 3 may have three configurations including an over-high interval, a middle interval and an over-low interval. If the distance between the DUT 11 and the carrier 10 is longer, the detection module can be set to the over-low interval and the detection module can detect a weaker signal or a lower intensity.

Figure 4A:
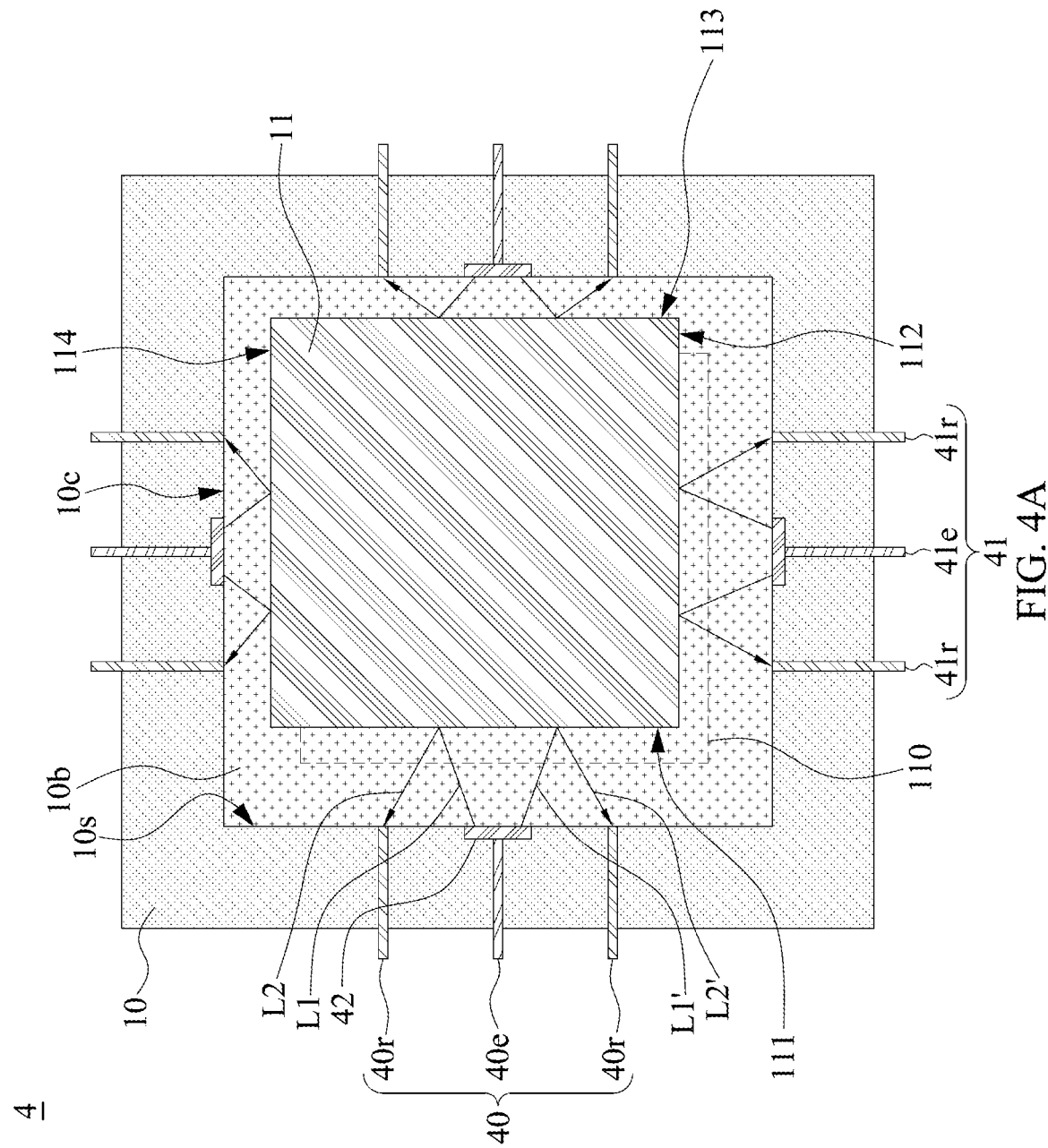
FIG. 4A is a top view of a testing device in accordance with some arrangements of the present disclosure.

FIG. 4A is a top view of a testing device 4 in accordance with some arrangements of the present disclosure. The testing device 4 in FIG. 4A is similar to the portion of the testing device 1 in FIG. 1B, with differences therebetween as follows.

There is one light transceiver adjacent to each of the lateral surfaces 111, 112, 113, and 114 of the DUT 11. The light transceivers may each include one or more light emitters (or light sources) and one or more light receivers (or light sensors). For example, the light transceiver 40 may include a light emitter 40e and light receivers 40r on both sides of the light emitter 40e.

An optical diffraction component 42 may be disposed on a surface of the light emitter 40e. The light emitter 40e may be configured to emit, radiate, or generate light toward the optical diffraction component 42. The optical diffraction component 42 may be configured to diffract or split the light emitted by the light emitter 40e into the light L1 and the light L1'. The optical diffraction component 42 may be configured to diffract the light based on the frequencies. The optical diffraction component 42 may include a grating. In some embodiments, the light emitter 40e may be configured to diffract or split the light toward the DUT 11.

The light L1 and the light L1' may include more than one light beam propagated toward the lateral surface 111 of the DUT 11 from different directions. In some embodiments, the light beams may have different incident angles.

Light L1 and the light L1' may each include a light beam of multiple frequencies. The light receivers 40r may be configured to receive or detect the reflected light L2 of the light L1 and the reflected light L2' of the light L1' as reflected by the lateral surface 111 of the DUT 11. The reflected light L2 of the light L1 and the reflected light L2' of the light L1' may correspond to one of different distances between the DUT 11 and the light transceiver 40.

Similarly, the light transceiver 41 may include a light emitter 41e, light receivers 41r on both sides of the light emitter 41e and an optical diffraction component disposed on a surface of the light emitter 41e.

Figure 4B:
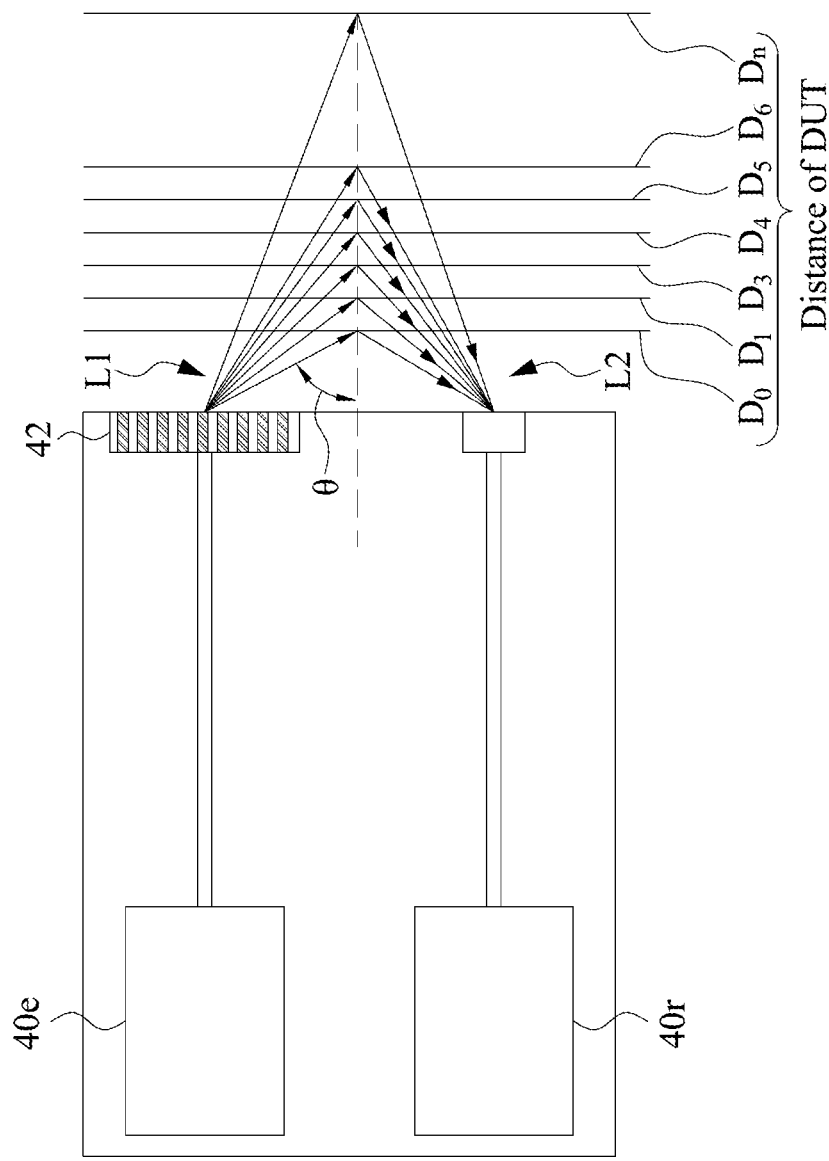
FIG. 4B is a top view of a part of a testing device in accordance with some arrangements of the present disclosure.

FIG. 4B is an enlarged view of a part of FIG. 4A in accordance with some arrangements of the present disclosure.

The light L1 (which may be diffracted or split) may include a light beam having multiple frequencies or a plurality of light beams. The light L2 received by the light receiver 40r may be one of reflections of the light L1 reflected by the DUT. The light L2 may correspond to one of different distances between the DUT and the light transceiver (such as the light transceiver 40). The light receiver 40r may include a spectrum meter. The light receiver 40r may be configured to measure the intensity or magnitude of the reflected light L2. Based on the intensity or magnitude of the reflected light L2, the distances between the DUT and the light transceiver (such as the light transceiver 40) can be determined. For example, a plurality of light beams (e.g., the light L1) may be reflected by the DUT, and one of the plurality of the reflected light beams (e.g., the light L2) may be received by the light receiver 40r.

The light receiver 40r may be configured to analyze the reflected light L2 and the wavelength, the frequency and/or the bandwidth thereof.

In some embodiments, the detection module of the testing device 4 may be configured to detect or determine a location relationship between the DUT 11 and the carrier 10 based on the wavelength (or the frequency) of the reflected light (such as the reflected light L2 and the reflected light L4).

For example, if the wavelength (or the frequency) of the reflected light L2 is longer (or the frequency is lower) (e.g., the reflected light L2 is a red light), the shift distance between the DUT 11 and the carrier 10 is $D_0$. If the wavelength (or the frequency) of the reflected light L2 is shorter (or the frequency is higher) (e.g., the reflected light L2 is a violet light), the shift distance between the DUT 11 and the carrier 10 is $D_6$.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90° or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within μm (micrometers) of the same plane, such as within 10, 5, 1, or 0.5 μm of the same plane. When referring to numerical values or characteristics as "substantially" the same, the term can refer to the values lying within ±10%, ±5%, ±1%, or ±0.5% of an average of the values.

The foregoing outlines features of several arrangements and detailed aspects of the present disclosure. The arrangements described in the present disclosure may be readily used as a basis for designing or modifying other processes and structures for carrying out the same or similar purposes and/or achieving the same or similar advantages of the arrangements introduced herein. Such equivalent constructions do not depart from the spirit and scope of the present disclosure, and various changes, substitutions, and alterations may be made without departing from the spirit and scope of the present disclosure.

What is claimed is:

1. A testing device, comprising:
    a socket configured to support a device under test (DUT); and
    a first detection module disposed at a first side of the socket and configured to detect a location relationship between the DUT and the socket, wherein the first detection module comprises a first light transceiver including:
        a first light emitter configured to emit a first light toward the DUT; and
        a first set of light receivers configured to receive a second light reflected by the DUT;
    wherein the first light emitter and the first set of light receivers are configured to determine a first distance between the DUT and the first side of the socket.

2. The testing device of claim 1, further comprising a second detection module disposed at a second side of the socket and configured to detect the location relationship between the DUT and the socket.

3. The testing device of claim 2, wherein the second detection module is disposed at a bottom side of the socket.

4. The testing device of claim 3, wherein the first detection module is configured to detect a tilt of the DUT.

5. The testing device of claim 2, wherein the second detection module comprises a second light transceiver including:
   a second light emitter configured to emit a third light toward the DUT; and
   a second set of light receivers configured to receive a fourth light reflected by the DUT;
   wherein the second light emitter and the second set of light receivers are configured to determine a second distance between the DUT and the second side of the socket.

6. The testing device of claim 5, wherein the second detection module comprises a third light transceiver including:
   a third light emitter configured to emit a third light toward the DUT; and
   a third set of light receivers configured to receive a fourth light reflected by the DUT;
   wherein the third light emitter and the third set of light receivers are configured to determine a third distance between the DUT and the second side of the socket; and
   wherein the second distance and the third distance are configured to determine a rotation of the DUT with respect to the second side of the socket in a top view.

7. The testing device of claim 1, wherein the first detection module is at least partially within the socket.

8. The testing device of claim 7, wherein the first detection module is disposed within a sidewall of the socket.

9. The testing device of claim 8, wherein the first detection module is configured to detect at least one of a displacement of the DUT, a shift of the DUT, and a rotation of the DUT.

10. The testing device of claim 1, wherein the first detection module comprises a second light transceiver including:
    a second light emitter configured to emit a third light toward the DUT; and
    a second set of light receivers configured to receive a fourth light reflected by the DUT;
    wherein the second light emitter and the second set of light receivers are configured to determine a second distance between DUT and the first side of the socket; and
    wherein the first distance and the second distance are configured to determine a rotation of the DUT with respect to the first side of the socket in a top view.

11. The testing device of claim 1, wherein the first light transceiver of the first detection module further includes:
    a second set of light receivers spaced apart from the first set of light receivers by the first light emitter;
    wherein the second set of light receivers are configured to receive a third light reflected by the DUT;
    wherein the first light emitter and the second set of light receivers are configured to determine a second distance between DUT and the first side of the socket; and
    wherein the first distance and the second distance are configured to determine a rotation of the DUT with respect to the first side of the socket in a top view.

12. The testing device of claim 11, wherein the first light transceiver of the first detection module further includes:
    an optical diffraction component configured to diffract the first light emitted by the first light emitter;
    wherein the first light is diffracted by the optical diffraction component and reflected by the DUT as the second light and the third light.

13. A testing device, comprising:
    a socket configured to support a device under test (DUT); and
    a first detection module disposed at a first side of the socket and configured to detect a location relationship between the DUT and the socket, wherein the first detection module comprises:
    a fiber disposed within the socket and exposed from the first side of the socket;
    a first light emitter configured to emit a first light transmitted through the fiber and toward the DUT; and
    a first light receiver configured to receive a second light reflected by the DUT and transmitted through the fiber.

14. A testing device, comprising:
    a socket configured to support a device under test (DUT); and
    a first detection module disposed at a first side of the socket and configured to detect a location relationship between the DUT and the socket, wherein the first detection module includes:
    a first light emitter configured to split a first light toward the DUT; and
    a first light receiver configured to receive one of a plurality of light beams reflected from the DUT, wherein the one of the plurality of light beams corresponds to one of different distances between the DUT and the first detection module.

15. A method for testing a device under test (DUT), comprising:
    placing the DUT on a carrier;
    detecting a location relationship between the DUT and the carrier to check whether the DUT is placed at a location within a predetermined shift from a predetermined location;
    emitting a first light toward the DUT by an incident angle with respect to the DUT;
    receiving, by a first set of light receivers, a second light reflected by the DUT; and
    determining the location relationship between the DUT and the carrier depending on which one of the first set of light receivers receives the second light.

* * * * *